US012648172B2

(12) United States Patent
Pandey et al.

(10) Patent No.: US 12,648,172 B2
(45) Date of Patent: Jun. 2, 2026

(54) TRANSISTOR WITH METAL FIELD PLATE CONTACT

(71) Applicant: GlobalFoundries U.S. Inc., Malta, NY (US)

(72) Inventors: Shesh M. Pandey, Saratoga Springs, NY (US); Rajendran Krishnasamy, Essex Junction, VT (US); Judson R. Holt, Ballston Lake, NY (US); Chung Foong Tan, Ballston Spa, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 677 days.

(21) Appl. No.: 17/984,736

(22) Filed: Nov. 10, 2022

(65) Prior Publication Data

US 2024/0162345 A1 May 16, 2024

(51) Int. Cl.
| | |
|---|---|
| *H10D 64/01* | (2025.01) |
| *H10D 30/01* | (2025.01) |
| *H10D 30/65* | (2025.01) |
| *H10D 64/00* | (2025.01) |
| *H10W 10/00* | (2026.01) |
| *H10W 10/17* | (2026.01) |

(52) U.S. Cl.
CPC ....... *H10D 30/655* (2025.01); *H10D 30/0281* (2025.01); *H10D 64/01* (2025.01); *H10D 64/117* (2025.01); *H10W 10/014* (2026.01); *H10W 10/17* (2026.01)

(58) Field of Classification Search
CPC .. H10D 30/655; H10D 30/0281; H10D 64/01;
H10D 30/603; H10D 30/0221; H10D 62/116; H10D 64/112; H10D 64/685; H10D 30/65; H10D 64/111–117; H01L 21/76224
See application file for complete search history.

(56) References Cited

U.S. PATENT DOCUMENTS

| | | | | |
|---|---|---|---|---|
| 5,930,633 A | * | 7/1999 | Liaw ................ | H10W 10/0145 257/E21.549 |
| 6,124,611 A | * | 9/2000 | Mori ..................... | H10D 30/63 257/329 |

(Continued)

FOREIGN PATENT DOCUMENTS

| | | |
|---|---|---|
| CN | 112909095 | 6/2021 |
| KR | 2011079021 A | 7/2011 |

OTHER PUBLICATIONS

Yue Hu et al., "Numerical investigation on L-shaped vertical field plate in high-voltage LDMOS", https://doi.org/10.1016/j.rinp.2019. 102547, Results in Physics, vol. 15, 2019, 102547, ISSN 2211-3797, 6 pages.

(Continued)

*Primary Examiner* — Maliheh Malek
(74) *Attorney, Agent, or Firm* — David Cain; Andrew M. Calderon; Calderon Safran & Wright P.C.

(57) ABSTRACT

The present disclosure relates to semiconductor structures and, more particularly, to a transistor with a metal field plate contact and methods of manufacture. The structure includes: a gate structure on a semiconductor substrate; a shallow trench isolation structure within the semiconductor substrate; and a contact extending from the gate structure and into the shallow trench isolation structure.

19 Claims, 4 Drawing Sheets

(56)                References Cited

U.S. PATENT DOCUMENTS

| | | | | |
|---|---|---|---|---|
| 7,122,876 B2 * | 10/2006 | Wu | H10D 62/152 | |
| | | | 257/725 | |
| 7,368,785 B2 * | 5/2008 | Chen | H10D 30/65 | |
| | | | 257/341 | |
| 7,851,857 B2 * | 12/2010 | Fu | H10D 62/393 | |
| | | | 257/337 | |
| 7,888,732 B2 * | 2/2011 | Denison | H10D 64/117 | |
| | | | 257/330 | |
| 8,004,039 B2 * | 8/2011 | Zinn | H10D 30/603 | |
| | | | 438/296 | |
| 8,174,071 B2 | 5/2012 | Tien et al. | | |
| 8,299,548 B2 * | 10/2012 | Komatsu | H10D 62/151 | |
| | | | 438/286 | |
| 8,513,712 B2 * | 8/2013 | Chu | H10D 64/519 | |
| | | | 257/256 | |
| 8,643,090 B2 * | 2/2014 | Shrivastava | H10D 62/116 | |
| | | | 257/E21.418 | |
| 8,716,791 B1 * | 5/2014 | Iravani | H10D 30/657 | |
| | | | 257/397 | |
| 8,766,358 B2 * | 7/2014 | Lee | H10D 62/116 | |
| | | | 257/334 | |
| 8,896,057 B1 * | 11/2014 | Yu | H10D 64/117 | |
| | | | 257/329 | |
| 8,987,813 B2 * | 3/2015 | Lee | H10D 64/513 | |
| | | | 257/330 | |
| 9,276,109 B2 * | 3/2016 | Röhrer | H10D 30/0281 | |
| 9,306,034 B2 * | 4/2016 | Tu | H10D 30/64 | |
| 9,343,538 B2 * | 5/2016 | Huang | H10D 64/516 | |
| 9,391,196 B1 * | 7/2016 | Chang | H10D 30/65 | |
| 9,443,958 B2 * | 9/2016 | Hsu | H10D 30/603 | |
| 9,590,053 B2 * | 3/2017 | Chou | H10D 30/65 | |
| 9,825,147 B2 * | 11/2017 | Hsu | H10D 62/292 | |
| 9,842,903 B2 * | 12/2017 | Lu | H10D 64/513 | |
| 9,853,021 B1 * | 12/2017 | Wang | H10D 30/603 | |
| 9,859,416 B2 * | 1/2018 | Mori | H10D 30/655 | |
| 9,871,132 B1 * | 1/2018 | Liu | H10D 30/0212 | |
| 10,008,573 B1 * | 6/2018 | Hsiao | H10D 30/601 | |
| 10,164,006 B1 * | 12/2018 | Ciavatti | H10D 62/103 | |
| 10,680,100 B2 * | 6/2020 | Su | H10D 30/603 | |
| 10,825,905 B2 * | 11/2020 | Kuo | H10D 30/0212 | |
| 10,910,478 B1 * | 2/2021 | Xu | H10D 64/513 | |
| 10,944,001 B1 * | 3/2021 | Zhang | H10D 8/00 | |
| 10,971,624 B2 * | 4/2021 | Wang | H10D 30/603 | |
| 11,411,086 B2 * | 8/2022 | Chen | H10D 64/111 | |
| 11,515,416 B2 * | 11/2022 | Mehrotra | H10D 30/603 | |
| 11,652,168 B2 * | 5/2023 | Lin | H10D 30/65 | |
| | | | 257/343 | |
| 11,916,115 B2 * | 2/2024 | Ho | H10D 30/603 | |
| 11,929,432 B2 * | 3/2024 | Uda | H10D 64/117 | |
| 12,230,693 B2 * | 2/2025 | He | H10D 30/0281 | |
| 12,289,913 B1 * | 4/2025 | Mun | H10D 64/111 | |
| 12,408,373 B1 * | 9/2025 | Mun | H10D 30/663 | |
| 2006/0261378 A1 * | 11/2006 | Moscatelli | H10D 30/603 | |
| | | | 257/E29.268 | |
| 2009/0026539 A1 * | 1/2009 | Birner | H10D 30/603 | |
| | | | 257/389 | |
| 2009/0140343 A1 * | 6/2009 | Feilchenfeld | H10D 30/0289 | |
| | | | 257/E29.256 | |
| 2009/0166736 A1 * | 7/2009 | Park | H10D 30/603 | |
| | | | 118/506 | |
| 2009/0256212 A1 * | 10/2009 | Denison | H10D 64/117 | |
| | | | 257/408 | |
| 2009/0273026 A1 * | 11/2009 | Wilson | H10D 62/151 | |
| | | | 257/E29.256 | |
| 2009/0273029 A1 * | 11/2009 | Tien | H10D 30/608 | |
| | | | 257/E29.256 | |
| 2009/0283825 A1 * | 11/2009 | Wang | H10D 30/603 | |
| | | | 257/E29.256 | |
| 2010/0022056 A1 * | 1/2010 | Donkers | H10D 10/021 | |
| | | | 257/571 | |
| 2010/0171149 A1 * | 7/2010 | Denison | H10D 18/251 | |
| | | | 257/173 | |
| 2010/0237412 A1 * | 9/2010 | Shrivastava | H10D 62/116 | |
| | | | 257/E29.256 | |
| 2011/0169076 A1 * | 7/2011 | Chang | H10D 30/665 | |
| | | | 438/270 | |
| 2011/0294273 A1 * | 12/2011 | Birner | H10D 64/519 | |
| | | | 438/296 | |
| 2012/0094457 A1 * | 4/2012 | Gabrys | H10D 30/65 | |
| | | | 257/E21.409 | |
| 2012/0217579 A1 * | 8/2012 | Huang | H10D 30/603 | |
| | | | 257/E29.256 | |
| 2012/0248528 A1 | 10/2012 | Wilson et al. | | |
| 2012/0319189 A1 * | 12/2012 | Wang | H10D 89/601 | |
| | | | 257/E29.198 | |
| 2013/0240996 A1 * | 9/2013 | Yin | H10D 84/038 | |
| | | | 257/E27.06 | |
| 2013/0277741 A1 * | 10/2013 | Guowei | H10D 30/603 | |
| | | | 257/E29.256 | |
| 2013/0277742 A1 * | 10/2013 | Lee | H10D 64/117 | |
| | | | 257/E29.261 | |
| 2014/0042527 A1 * | 2/2014 | Lee | H10D 64/513 | |
| | | | 257/330 | |
| 2014/0061791 A1 * | 3/2014 | Yu | H10D 64/117 | |
| | | | 257/E29.261 | |
| 2014/0320174 A1 * | 10/2014 | Lu | H10D 30/65 | |
| | | | 327/109 | |
| 2014/0339632 A1 * | 11/2014 | Yu | H10D 30/65 | |
| | | | 438/286 | |
| 2014/0367778 A1 * | 12/2014 | Sharma | H10D 30/65 | |
| | | | 438/286 | |
| 2015/0014768 A1 * | 1/2015 | Chen | H10D 62/116 | |
| | | | 438/286 | |
| 2015/0243777 A1 * | 8/2015 | Fujii | H10D 30/65 | |
| | | | 257/337 | |
| 2015/0340448 A1 * | 11/2015 | Babcock | H10D 84/401 | |
| | | | 257/340 | |
| 2015/0349050 A1 * | 12/2015 | Fang | H10D 64/513 | |
| | | | 438/270 | |
| 2016/0099340 A1 * | 4/2016 | Hsu | H10D 30/603 | |
| | | | 438/282 | |
| 2016/0111488 A1 * | 4/2016 | Lu | H10D 64/513 | |
| | | | 438/270 | |
| 2016/0149007 A1 * | 5/2016 | Chou | H10D 30/65 | |
| | | | 257/339 | |
| 2016/0211348 A1 * | 7/2016 | Yoshida | H10D 84/83 | |
| 2016/0336410 A1 * | 11/2016 | Hsiao | H10D 64/112 | |
| 2017/0025532 A1 * | 1/2017 | Mori | H10D 30/655 | |
| 2017/0104097 A1 * | 4/2017 | Park | H10D 64/117 | |
| 2017/0194490 A1 * | 7/2017 | Li | H10D 64/519 | |
| 2017/0243977 A1 * | 8/2017 | Lin | H10D 64/518 | |
| 2017/0278963 A1 * | 9/2017 | Liu | H10D 30/655 | |
| 2017/0352731 A1 * | 12/2017 | Kuo | H10D 30/0212 | |
| 2018/0175192 A1 * | 6/2018 | Fujii | H10D 30/65 | |
| 2019/0088777 A1 * | 3/2019 | Lu | H10D 30/60 | |
| 2019/0097044 A1 * | 3/2019 | Lee | H10D 30/658 | |
| 2019/0259749 A1 * | 8/2019 | Ishii | H10D 84/038 | |
| 2019/0305129 A1 * | 10/2019 | Uda | H10D 62/116 | |
| 2020/0013888 A1 * | 1/2020 | Su | H10D 30/603 | |
| 2020/0075759 A1 * | 3/2020 | Pala | H10D 30/0285 | |
| 2020/0395452 A1 * | 12/2020 | Wang | H10D 30/603 | |
| 2021/0028299 A1 * | 1/2021 | Liu | H10D 30/65 | |
| 2021/0036112 A1 * | 2/2021 | Xu | H10D 30/603 | |
| 2021/0074851 A1 * | 3/2021 | Chiu | H10D 30/65 | |
| 2021/0234041 A1 * | 7/2021 | Jin | H10D 30/603 | |
| 2021/0296451 A1 * | 9/2021 | Chen | H10D 64/111 | |
| 2021/0367064 A1 * | 11/2021 | Liu | H10D 30/0281 | |
| 2022/0093793 A1 * | 3/2022 | Mehrotra | H10D 30/603 | |
| 2022/0181444 A1 * | 6/2022 | Toner | H10D 30/603 | |
| 2022/0285551 A1 * | 9/2022 | Yang | H10D 30/0281 | |
| 2022/0328684 A1 * | 10/2022 | Lin | H10D 30/65 | |
| 2022/0336658 A1 * | 10/2022 | Cho | H10D 84/038 | |
| 2023/0238457 A1 * | 7/2023 | Lin | H10D 30/65 | |
| | | | 257/343 | |
| 2023/0420464 A1 * | 12/2023 | Yu | H10D 84/038 | |
| 2024/0097051 A1 * | 3/2024 | Li | H10D 62/114 | |
| 2024/0203815 A1 * | 6/2024 | Bader | H10D 30/015 | |
| 2024/0395929 A1 * | 11/2024 | Lin | H10D 30/65 | |
| 2025/0006823 A1 * | 1/2025 | Schweda | H10D 64/111 | |

(56) References Cited

U.S. PATENT DOCUMENTS

| | | | | |
|---|---|---|---|---|
| 2025/0089311 A1* | 3/2025 | Tsai | ..................... | H10D 62/116 |
| 2025/0267892 A1* | 8/2025 | Xu | ....................... | H10D 30/603 |
| 2025/0338532 A1* | 10/2025 | Edwards | ............. | H10D 62/154 |

OTHER PUBLICATIONS

Specification and drawings in U.S. Appl. No. 17/872,360, filed Jul. 25, 2022, 25 pages.
European Search Report and Opinion dated Mar. 5, 2024 in EP Application No. 23198686.0-1212, 10 pages.
Non-Final Office Action dated Feb. 14, 2025 in U.S. Appl. No. 17/872,360, 31 pages.
Ko, Semiconductor device and method for manufacturing the same, 2011, machine translation of KR 2011-0079021A, pp. 1-4 (Year: 2011).
Final Office Action dated Jul. 22, 2025 in U.S. Appl. No. 17/872,360, 23 pages.
Office Action dated Nov. 4, 2025 in U.S. Appl. No. 17/872,360 13 pages.

* cited by examiner

TRANSISTOR WITH METAL FIELD PLATE CONTACT

BACKGROUND

The present disclosure relates to semiconductor structures and, more particularly, to a transistor with a metal field plate contact and methods of manufacture.

A laterally-diffused metal-oxide semiconductor (LD-MOS) is a planar double-diffused MOSFET (metal-oxide-semiconductor field-effect transistor) used in amplifiers, including microwave power amplifiers, RF power amplifiers and audio power amplifiers. The fabrication of LDMOS devices mostly involves various ion-implantation and subsequent annealing cycles. As an example, the drift region of a power MOSFET is fabricated using up to three ion implantation sequences in order to achieve the appropriate doping profile needed to withstand high electric fields.

A silicon-based RF LDMOS (radio-frequency LDMOS) is a widely used RF power amplifier in mobile networks, enabling the majority of the world's cellular voice and data traffic. LDMOS devices are widely used in RF power amplifiers for base-stations as the requirement is for high output power with a corresponding drain to source breakdown voltage. Compared to other devices such as GaAs FETs, RF LDMOS shows a lower maximum power gain frequency.

SUMMARY

In an aspect of the disclosure, a structure comprises: a gate structure on a semiconductor substrate; a shallow trench isolation structure within the semiconductor substrate; and a contact extending from the gate structure and into the shallow trench isolation structure.

In an aspect of the disclosure, a structure comprises: a semiconductor substrate; a shallow trench isolation structure within the semiconductor substrate; a gate structure extending partially over the shallow trench isolation structure; a drain diffusion adjacent to the shallow trench isolation structure; and a contact electrically connected to the gate structure and extending within the shallow trench isolation structure between the drain diffusion and the gate structure.

In an aspect of the disclosure, a method comprises: forming a gate structure on a semiconductor substrate; forming a shallow trench isolation structure within the semiconductor substrate; and forming a contact extending from the gate structure and into the shallow trench isolation structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a transistor with a metal field plate contact and methods of manufacture. More specifically, the present disclosure relates to a laterally diffused metal oxide semiconductor (LDMOS) with a metal field plate extending within a shallow trench isolation structure. Advantageously, the metal field plate provides improved performance of the LDMOS.

The transistor of the present disclosure can be manufactured in a number of ways using a number of different tools. In general, though, the methodologies and tools are used to form structures with dimensions in the micrometer and nanometer scale. The methodologies, i.e., technologies, employed to manufacture the transistor of the present disclosure have been adopted from integrated circuit (IC) technology. For example, the structures are built on wafers and are realized in films of material patterned by photolithographic processes on the top of a wafer. In particular, the fabrication of the transistor uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
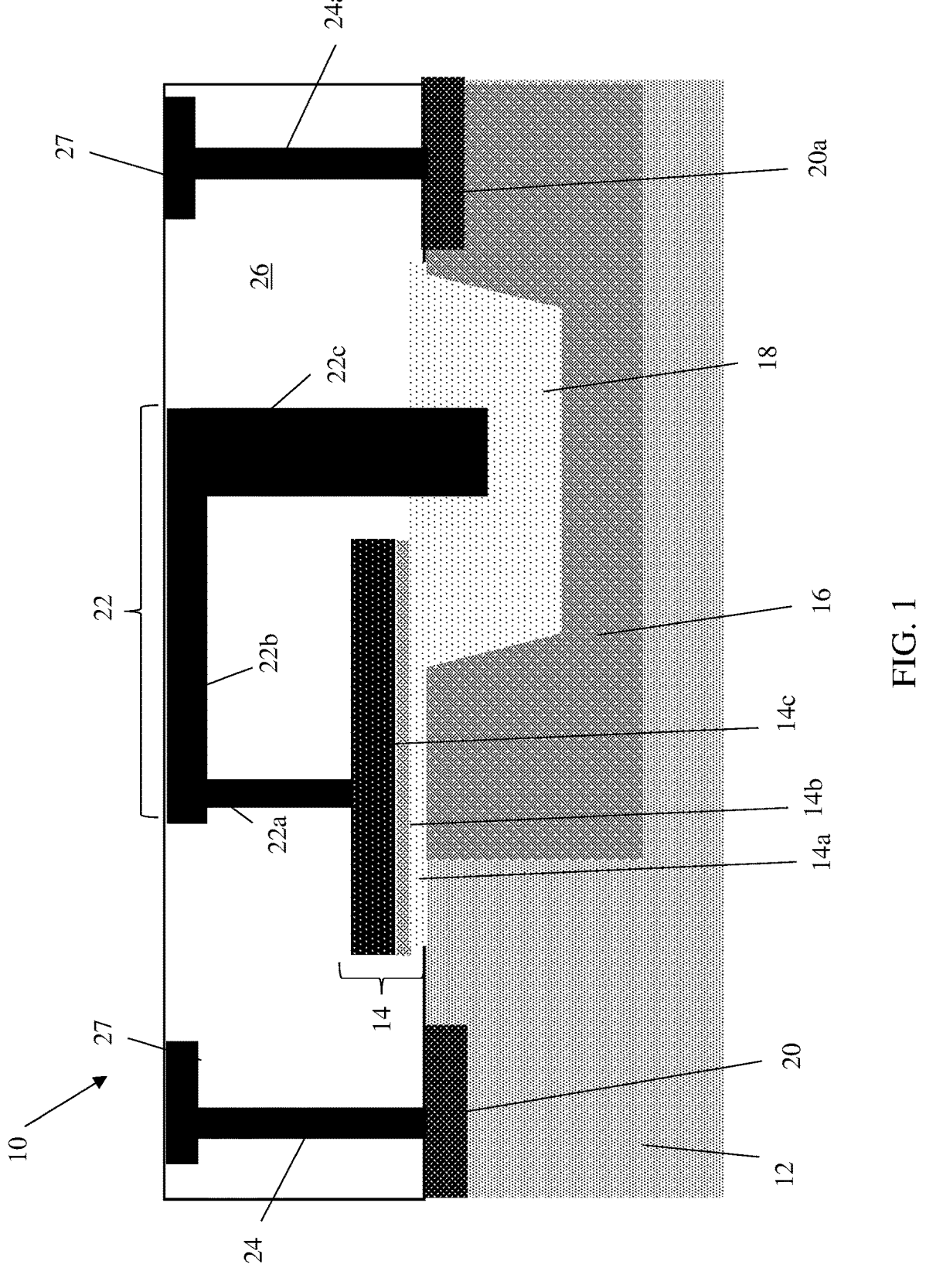
FIG. 1 shows a transistor with a metal plate contact and methods of manufacture in accordance with aspects of the present disclosure.

FIG. 1 shows a transistor with a metal plate contact and respective manufacturing processes in accordance with aspects of the present disclosure. More particularly, the structure 10 of FIG. 1 includes a gate structure 14 over a semiconductor substrate 12. In embodiments, the gate structure 14 may be representative of an LDMOS. The semiconductor substrate 12 may be composed of any suitable bulk material including, but not limited to, Si, SiGe, SiGeC, SiC, GaAs, InAs, InP, and other III/V or II/VI compound semiconductors. Preferably, the semiconductor substrate 12 may comprise a p-type Si substrate or a p-well in the semiconductor substrate 12. The semiconductor substrate 12 may also be semiconductor-on-insulator (SOI) technology.

In embodiments, the gate structure 14 may be provided over an N-well 16 and a shallow trench isolation structure 18. As described with respect to FIG. 3A, the gate structure 14 may be fabricated using deposition, lithography and etching processes as is known in the art. The shallow trench isolation structure 18 can be formed by conventional lithography, etching and deposition methods known to those of skill in the art as also described in FIG. 3A.

The gate structure 14 may include gate dielectric materials 14a, 14b and a gate electrode 14c. The gate dielectric materials 14a, 14b may be a combination of $SiO_2$ and a high-k dielectric material, respectively. In embodiments, the gate dielectric material 14a may be the same insulator material as the insulator material of the shallow trench isolation structure 18. The high-k dielectric gate material 14b may be, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate electrode 14c may be metal material or polysilicon material. The metal material may be workfunction materials such as, e.g., Ti, TiAlC, Al, TiAl, TaN, TiN, TiC, HfTi, TiSi, TaSi, TaC and/or Co.

Diffusion regions (e.g., source and drain regions) 20, 20a may be provided adjacent to the gate structure 14. The diffusion regions 20, 20a may be n-type diffusion regions for source and drain regions. The diffusion regions 20, 20a may be respectively connected to a source contact (interconnect) 24 and a drain contact (interconnect) 24a. A wiring structure 27 may be electrically connected to each of the source contact 24 and the drain contact 24a. The source contact 24 and drain contact 24a may be on a same back end of the line wiring layer, e.g., CA level. The wiring structure 27 may be on a same level, e.g., M1 level, as a wiring structure 22b of a gate contact 22.

Figure 3A:
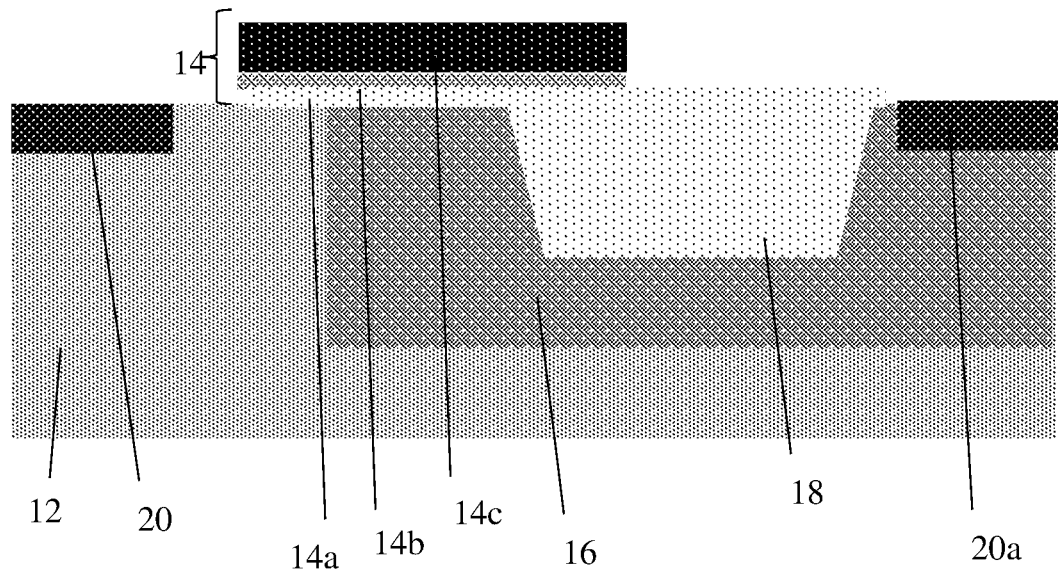
FIGS. 3A-3C show processing steps for the fabrication of the transistor with the metal plate contact shown in FIG. 1, in accordance with aspects of the present disclosure.

The diffusion regions 20, 20a and the N-well 16 may be formed by a conventional ion implantation process that introduces a concentration of n-type dopant into the semiconductor substrate 12 as described in FIG. 3A. The drain region 20a may be formed in the N-well 16, adjacent to the shallow trench isolation structure 18. The source contact 24, the drain contact 24a and wiring structures 27 may be provided in interlevel dielectric material 26. The interlevel dielectric material 26 may include layers of oxide and nitride, as an illustrative, non-limiting example.

Still referring to FIG. 1, a gate contact 22 is electrically (e.g., directly) connected to the gate structure 14. In embodiments, the gate contact 22 may be provided in the interlevel dielectric material 26 and may include an interconnect contact 22a, a wiring structure 22b and a metal field plate 22c extending into the shallow trench isolation structure 18. The interconnect contact 22a and the metal field plate 22c may be on a same wiring level with the wiring structure 22b, which are also both connected to the wiring structure 22b. In this way, each part of the gate contact 22 is electrically connected to the gate structure 14. The gate contact 22 may comprise metal material such as, e.g., aluminum, copper, tungsten or other back end of the line conductive material.

In embodiments, the shallow trench isolation structure 18 may define a drift region between an edge of the gate structure 14 and a drain region, e.g., diffusion region 20a. The depth and width of the metal field plate 22c extending into the shallow trench isolation structure 18 may be adjusted to optimize device performance. For example, in embodiments, the metal field plate 22c may extend deeply into the shallow trench isolation structure 18 without reaching or contacting the N-well 16, i.e., insulator material of the shallow trench isolation structure will electrically isolate the metal field plate 22c from the N-well 16.

In operation, the metal field plate 22c may attract electrons close to the interface of the shallow trench isolation structure 18 and the diffusion region 20a. Due to this attraction of electrons within the shallow trench isolation structure 18, for example, applying a positive bias to the gate structure 14 will reduce resistance in the drift region which, in turn, improves transconductance (gm), Ron and breakdown voltage, and reduces leakage.

Figure 2:
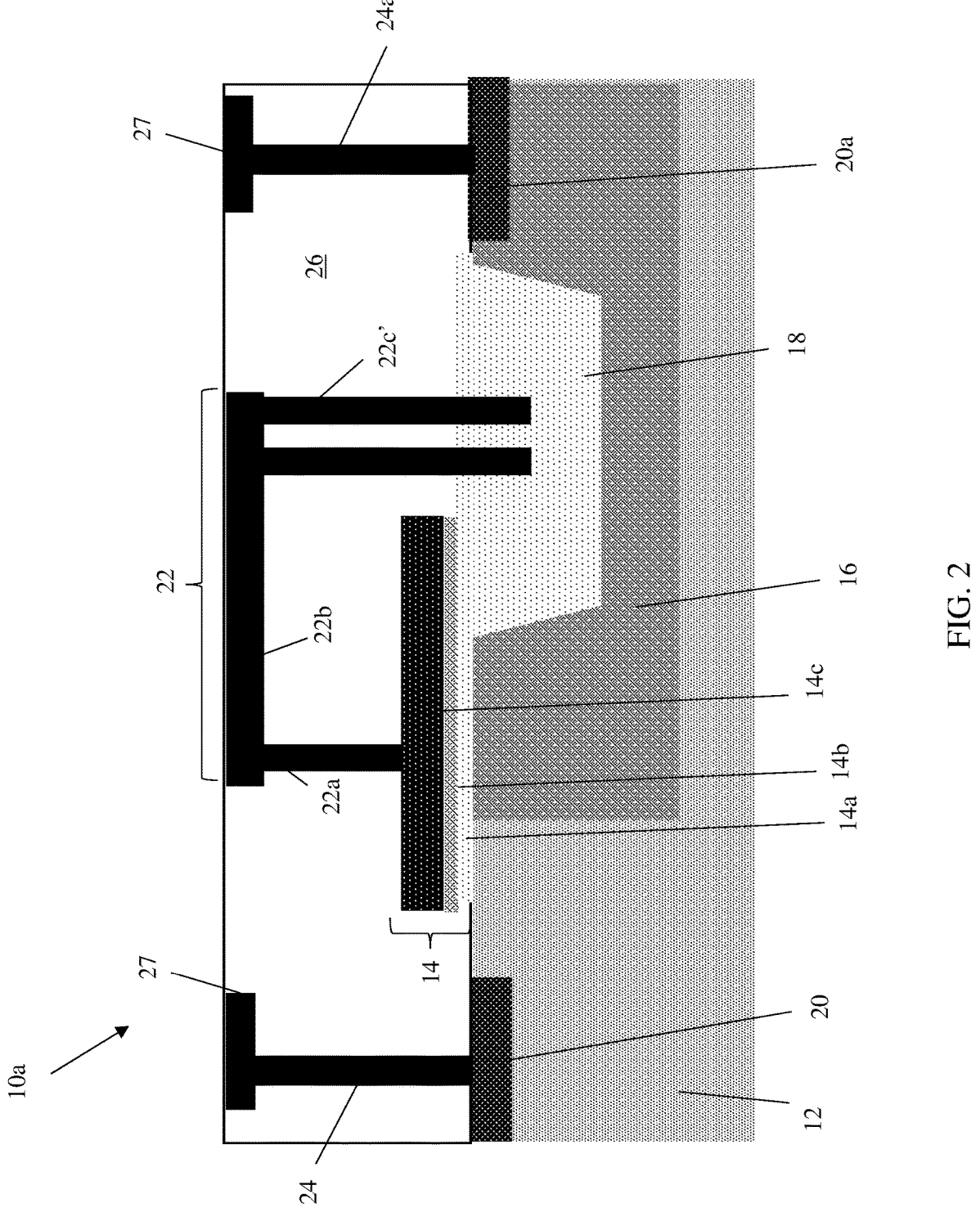
FIG. 2 shows a transistor with a metal plate contact in accordance with additional aspects of the present disclosure.

FIG. 2 shows a structure in accordance with additional aspects of the present disclosure. More particularly, the structure 10a of FIG. 2 includes a contact 22 provided to the gate structure 14 and which comprises two metal field plates 22c' extending into the shallow trench isolation structure 18. The remaining features of the structure 10a are similar to the structure 10 of FIG. 1. Again, in operation, the metal field plates 22c' may attract electrons close to the interface of the shallow trench isolation structure 18 and the diffusion region 20a by applying a positive bias to the gate structure which, in turn, will reduce resistance in the drift region thereby improving transconductance (gm), Ron and breakdown voltage (by reducing the electric field), and reduces leakage.

Figure 3B:
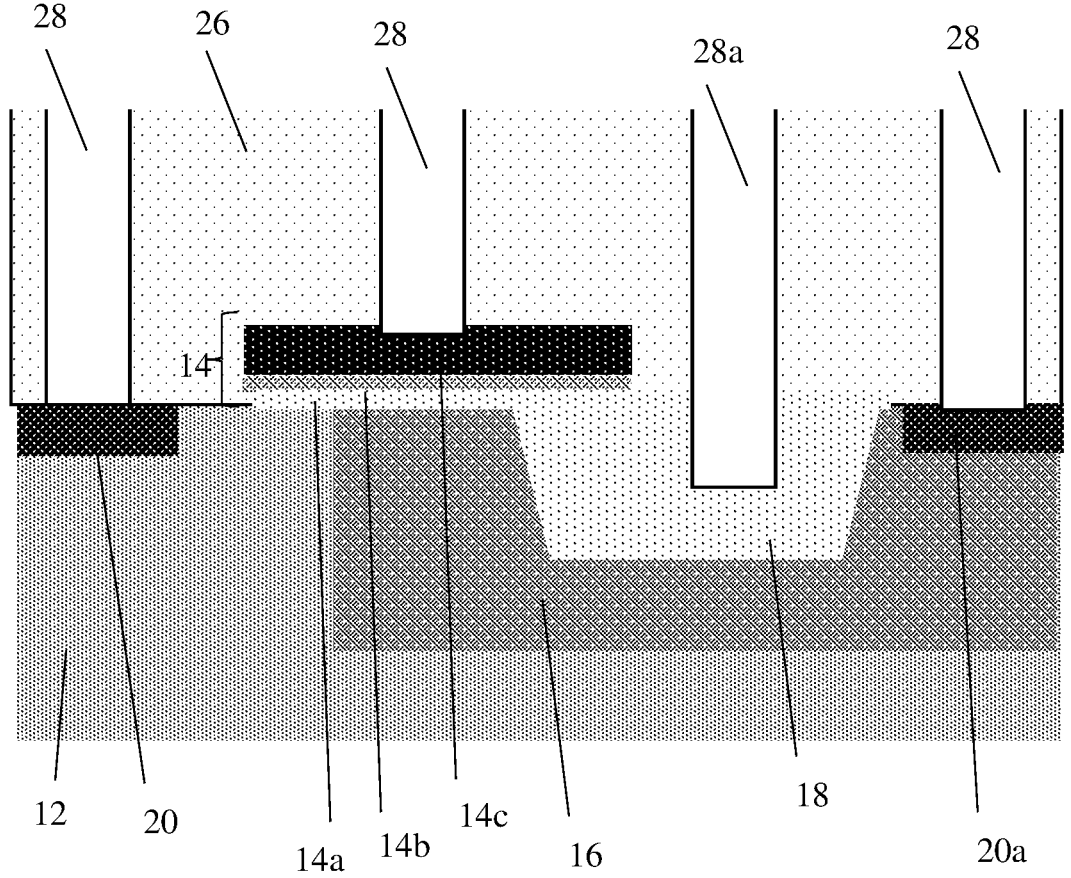
Figure 3C:
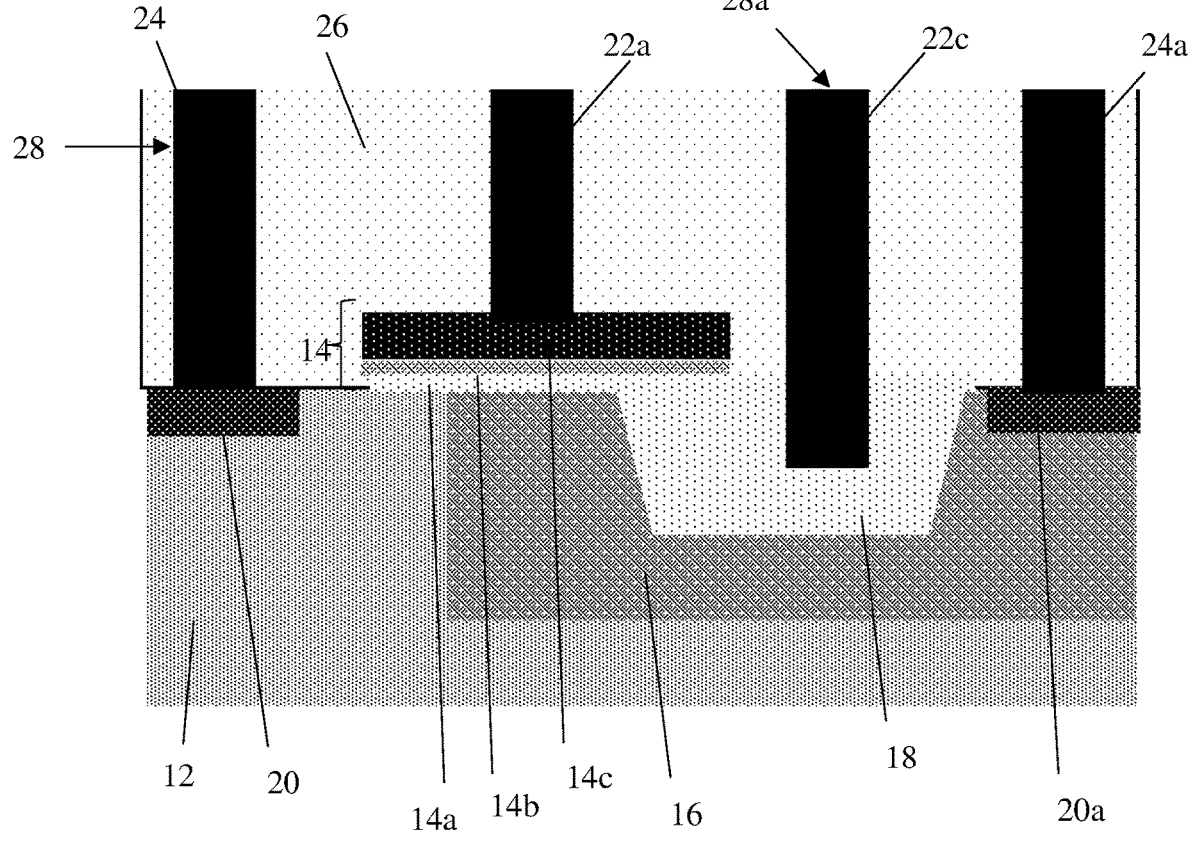

FIGS. 3A-3C show processing steps for the fabrication of the structure 10 shown in FIG. 1. It should be recognized that the processing steps shown in FIGS. 3A-3C may also be used to fabricate the structure 10a shown in FIG. 2, noting that an additional trench may be formed extending into the shallow trench isolation structure 18.

As shown in FIG. 3A, the shallow trench isolation structure 18 can be formed in the semiconductor substrate 12 by using conventional lithography, etching and deposition methods. For example, a resist formed over the semiconductor substrate 12 is exposed to energy (light) and developed utilizing a conventional resist developer to form a pattern (opening). An etching process with a selective chemistry, e.g., reactive ion etching (RIE), will be used to transfer the pattern from the resist to the semiconductor substrate 12 to form a trench in the semiconductor substrate 12. Following the resist removal by a conventional oxygen ashing process or other known stripants, insulator material (e.g., $SiO_2$) can be deposited by any conventional deposition processes, e.g., chemical vapor deposition (CVD) processes. Additional insulator material (e.g., $SiO_2$) may be deposited and patterned on the surface of the semiconductor substrate 12 to form the gate dielectric material 14a.

The diffusion regions 20, 20a and the N-well 16 may be formed by a conventional ion implantation process that introduces a concentration of n-type dopant into the semiconductor substrate 12. In embodiments, respective patterned implantation masks may be used to define selected areas exposed for the implantations. The implantation mask used to select the exposed area for forming the N-well 16 may be stripped after implantation, and before deposition of the implantation mask used to form the diffusion regions 20, 20a. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The n-type dopants may be, e.g., Arsenic (As), Phosphorus (P) and Sb, among other suitable examples.

The gate structure 14 may be formed by conventional deposition and patterning processes. For example, the gate dielectric materials 14a, 14b and the gate electrode 14c may be deposited by conventional atomic layer deposition (ALD) processes or plasma enhanced CVD (PECVD) processes; whereas the gate electrode 14 may be deposited by a CVD process. In embodiments, the gate dielectric material 14a may be deposited at the same time and with the same insulator material of forming the shallow trench isolation structure 18, e.g., using a CVD process. Following the deposition processes, the materials 14a, 14b, 14c may be patterned using conventional lithography and etching processes, with the gate structure 14 extending over the shallow trench isolation structure 18, the N-well 16 and p-type semiconductor substrate 12. Sidewall spacers may be formed on the gate structure by a deposition of insulator material, e.g., oxide and/or nitride, followed by an anisotropic etching process as is known in the art. In embodiments, the diffusion regions 20, 20a may be formed after the gate structure 14.

In FIG. 3B, the interlevel dielectric material 26 is deposited over the gate structure 14 and diffusion regions 20, 20a. In embodiments, the interlevel dielectric material 26 may be alternating layers of $SiO_2$ and nitride, deposited by a conventional deposition method, e.g., CVD.

Contact holes 28, 28a may be etched into the interlevel dielectric material 26. In embodiments, the contact holes 28 may be etched to expose the gate electrode 14a and diffusion regions 20, 20a; whereas the contact hole 28a may be etched deeply into the shallow trench isolation structure 18. In embodiments, the etching process may include, e.g.: (i) a pre-etch with a deep hole for the contact hole 28a, and then patterning of the contact holes 28, with the contact hole 28a being etched into the shallow trench isolation structure 18; (ii) using a RIE that is super selective to silicide or polysilicon or metal which will stop on the gate structure 14 and diffusion regions 20, 20*a* and continue into the shallow trench isolation structure 18; or (iii) use two separate RIE steps (e.g., one for the deeper hole 28*a* and the other etch for the contact holes 28).

In FIG. 3C, the contacts 22, 22*c*, 24, 24*a* are formed by depositing metal material within the contact holes 28, 28*a*. The metal material may be, for example, aluminum, copper, tungsten or other back end of the line conductive material. The metal material may be deposited by a conventional deposition process, e.g., CVD, followed by a planarization process to remove any excess material on a surface of the interlevel dielectric material. In embodiments, the planarization process may be a chemical mechanical polishing (CMP) process.

As should be understood by those of skill in the art, prior to the deposition of the metal material, a silicide contact may be provided on the polysilicon material of the gate structure 14 and the diffusion regions 20, 20*a*. The silicide process begins with deposition of a thin transition metal layer, e.g., nickel, cobalt or titanium, over fully formed and patterned semiconductor devices (e.g., doped or ion implanted source region 20 and drain region 20*a* and respective device 14). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts would not be required on the devices when the gate structure is composed of a metal material.

Referring back to FIG. 1, wiring structures 27 may be formed to the source and drain contacts 24, 24*a*, and the wiring structure 22*b* may be formed connected to the gate contact 22*a* to the metal field plate 22*c*. The wiring structures 27, 22*b* may be formed by depositing additional layer(s) of interlevel dielectric material on the interlevel dielectric material, followed by a patterning process to form trenches exposing the contacts 24, 24*a*, 22*a* and metal field plate 22*c*. A metal material may be deposited within the trenches, followed by a CMP process. In embodiments, the additional layer(s) of interlevel dielectric material and the metal material may be deposited by conventional CVD processes. The additional layer(s) of interlevel dielectric material may be $SiO_2$ and/or nitride and the metal material may be similar or the same as the metal material used for the contacts 24, 24*a*, 22*a* and field plate 22*c*.

The transistor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a gate structure on a semiconductor substrate, the gate structure comprising a gate electrode over a first gate dielectric material and a second gate dielectric material, the second gate dielectric material being different than the first gate dielectric material and in contact with both the first gate dielectric material and the gate electrode;
   a shallow trench isolation structure within the semiconductor substrate; and
   a contact extending from the gate structure and into the shallow trench isolation structure, the contact comprising an interconnect contact, a wiring structure and a field plate, the interconnect contact and the field plate being on a same wiring level with and contacting the wiring structure, the interconnect contact extending from and contacting a top surface of the gate structure, and the field plate being positioned on a side of and remotely from the gate structure.

2. The structure of claim 1, wherein the gate structure partially extends over the shallow trench isolation structure.

3. The structure of claim 1, wherein the contact comprises a gate contact, a wiring structure and a metal field plate that extends into the shallow trench isolation structure.

4. The structure of claim 3, wherein the metal field plate comprises a single interconnect structure electrically connected to the gate structure and which extends into the shallow trench isolation structure.

5. The structure of claim 3, wherein the metal field plate comprises a plurality of interconnect structures electrically connected to the gate structure and which extend into the shallow trench isolation structure.

6. The structure of claim 2, further comprising a drain diffusion separated from the gate structure by the shallow trench isolation structure.

7. The structure of claim 6, wherein the contact extends between an edge of the gate structure and the drain diffusion.

8. The structure of claim 1, wherein the gate structure comprises a laterally diffused metal oxide semiconductor (LDMOS) device.

9. The structure of claim 1, wherein the first gate dielectric material comprises a same insulator material as the shallow trench isolation structure and the second gate dielectric material comprises a high-k dielectric material.

10. The structure of claim 9, wherein the first and second gate dielectric materials extend over an N-well and the shallow trench isolation structure.

11. The structure of claim 10, wherein the shallow trench isolation structure is within the N-well and the contact comprises a metal field plate comprising two interconnect structures extending into the shallow trench isolation structure.

12. The structure of claim 11, wherein the contact which extends into the shallow trench isolation structure is separated from the N-well by insulator material of the shallow trench isolation structure.

13. The structure of claim 1, wherein the contact directly contacts the top surface of the gate structure.

14. A structure comprising:
a semiconductor substrate;
a shallow trench isolation structure within the semiconductor substrate;
a gate structure extending partially over the shallow trench isolation structure, the gate structure comprising a gate electrode over a first gate dielectric material and a second gate dielectric material, the second gate dielectric material being different than the first gate dielectric material and in contact with both the first gate dielectric material and the gate electrode;
a drain diffusion adjacent to the shallow trench isolation structure; and
a contact electrically connected to a top surface of the gate electrode of the gate structure and extending within the shallow trench isolation structure between the drain diffusion and the gate structure, wherein the contact comprises a metal field plate with two interconnect structures extending into the shallow trench isolation structure, and wherein all portions of the metal field plate are remotely positioned from and not contacting the gate structure.

15. The structure of claim 14, wherein the contact comprises a gate contact, a wiring structure and the metal field plate, the metal field plate extends into the shallow trench isolation structure.

16. The structure of claim 14, wherein the gate structure comprises a laterally diffused metal oxide semiconductor (LDMOS) device.

17. The structure of claim 14, wherein the first gate dielectric material and the shallow trench isolation structure comprise a same insulator material and the second gate dielectric material comprises a high-k dielectric material.

18. The structure of claim 17, wherein the shallow trench isolation structure is within an N-well and the gate dielectric material extends over the N-well and the shallow trench isolation structure.

19. A method comprising:
forming a gate structure on a semiconductor substrate, the gate structure comprising a gate electrode over a first gate dielectric material and a second gate dielectric material, the second gate dielectric material being different than the first gate dielectric material and in contact with both the first gate dielectric material and the gate electrode;
forming a shallow trench isolation structure within the semiconductor substrate; and
forming a contact extending from the gate structure and into the shallow trench isolation structure, the contact comprising an interconnect contact, a wiring structure and a field plate, the interconnect contact and the field plate being on a same wiring level with and contacting the wiring structure, the interconnect contact extending from and contacting a top surface of the gate structure, and the field plate being positioned on a side of and remotely from the gate structure.

\* \* \* \* \*